(12) United States Patent
Li

(10) Patent No.: US 11,069,532 B2
(45) Date of Patent: Jul. 20, 2021

(54) METHOD FOR MANUFACTURING NICKEL SILICIDE

(71) Applicant: Shanghai Huali Integrated Circuit Corporation, Shanghai (CN)

(72) Inventor: Zhonghua Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 16/704,153

(22) Filed: Dec. 5, 2019

(65) Prior Publication Data

US 2021/0050217 A1    Feb. 18, 2021

(30) Foreign Application Priority Data

Aug. 13, 2019    (CN) .......................... 201910742951.9

(51) Int. Cl.

| *H01L 21/283* | (2006.01) |
|---|---|
| *H01L 21/28* | (2006.01) |
| *H01L 29/66* | (2006.01) |
| *H01L 29/78* | (2006.01) |

(52) U.S. Cl.
CPC ...... *H01L 21/283* (2013.01); *H01L 21/28052* (2013.01); *H01L 29/66795* (2013.01); *H01L 29/7848* (2013.01)

(58) Field of Classification Search
CPC ............. H01L 21/283; H01L 21/28052; H01L 29/66795; H01L 29/7848
USPC ......................................................... 438/303
See application file for complete search history.

(56) References Cited

U.S. PATENT DOCUMENTS

| 6,689,687 B1 | 2/2004 | Bertrand et al. | |
|---|---|---|---|
| 2004/0087121 A1* | 5/2004 | Kammler | H01L 29/6653 438/528 |
| 2008/0057685 A1* | 3/2008 | Pawlak | H01L 21/324 438/533 |
| 2008/0290456 A1* | 11/2008 | Miyashita | H01L 27/105 257/530 |

(Continued)

FOREIGN PATENT DOCUMENTS

| CN | 1649112 A | 8/2005 |
|---|---|---|
| CN | 101150070 A | 3/2008 |

(Continued)

OTHER PUBLICATIONS

Mar. 5, 2021—(CN) CNIPA First Search Report Appn 201910742951.9.

*Primary Examiner* — Igwe U Anya
(74) *Attorney, Agent, or Firm* — Banner & Witcoff, Ltd.

(57) ABSTRACT

The invention discloses a method for manufacturing nickel silicide. The method comprises: Step 1: providing a semiconductor substrate, wherein the semiconductor substrate has an exposed silicon surface which is a formation region of nickel silicide; Step 2: carrying out pre-amorphization ion implantation to form an amorphous layer in the formation region of the nickel silicide, wherein an implantation source of the pre-amorphization ion implantation is xenon; and Step 3: forming the nickel silicide in the formation region of the nickel silicide by self-alignment. Xenon which is a non-radioactive inert gas with the maximum mass is adopted to optimize the uniformity of an interface layer between the amorphous layer and silicon, so that the uniformity of the ohm contact resistance of the nickel silicide is improved.

12 Claims, 2 Drawing Sheets

(56) References Cited

U.S. PATENT DOCUMENTS

2011/0169058 A1* 7/2011 Frye ................. H01L 21/28518
    257/288
2014/0227843 A1* 8/2014 Tsukamoto ....... H01L 27/11568
    438/275
2017/0207166 A1* 7/2017 Lai .................. H01L 21/823864
2018/0301559 A1* 10/2018 Liaw ................ H01L 21/76831

FOREIGN PATENT DOCUMENTS

| CN | 102468172 A | 5/2012 |
|----|-------------|--------|
| CN | 103972060 A | 8/2014 |

* cited by examiner

METHOD FOR MANUFACTURING NICKEL SILICIDE

CROSS REFERENCE TO RELATED APPLICATIONS

The present application claims priority to and the benefit of Chinese Patent Application No. 201910742951.9 filed on Aug. 13, 2019, the disclosure of which is incorporated herein by reference in its entirety as part of the present application.

BACKGROUND

The invention relates to a method for manufacturing semiconductor integrated circuits, in particular to a method for manufacturing nickel silicide.

When semiconductor integrated circuits are manufactured, metal silicides are usually used to reduce the contact resistance. For instance, metal silicides are generally applied to source regions, drain regions, and contact regions between polysilicon gates and contact pins at the top of CMOS devices such as NMOS transistors or PMOS transistors. The metal silicides are typically formed through a self-alignment process, that is, a region where a metal silicide is to be formed is opened through a lithography process to expose silicon, and other regions are covered with a barrier layer formed by a dielectric layer such as a nitride layer; then a metal or metal alloy is formed; and afterwards, annealing is carried out to enable the formed metal or metal alloy to react with the silicon in contact with the metal or metal alloy to form, by self-alignment, the metal silicide in the region where the metal silicide is to be formed. With the development of the process and constant scaling-down of key dimensions of the devices, nickel silicide is commonly applied to process nodes smaller than 65 nm.

In general, the nickel silicide is formed as follows: a nickel-platinum alloy is formed first and is then annealed, and the nickel-platinum alloy makes contact with silicon in the annealing process to form the nickel silicide. The annealing process typically includes two steps of annealing, wherein during primary annealing, the nickel-platinum alloy reacts with silicon to form Ni2Si; and during secondary annealing, Ni2Si is converted into NiSi.

During an ultra-shallow junction process, pre-amorphization ion implantation is carried out before the growth of the nickel silicide to form an amorphous layer on the surface of silicon and to form an interface layer between the amorphous layer and the silicon. An existing common pre-amorphization ion implantation process is silicon or germanium ion implantation at a normal temperature, or silicon ion implantation at a low temperature. Through pre-amorphization ion implantation, the thickness uniformity of the nickel silicide growing on the surface of the silicon in all regions of a semiconductor substrate is kept good, that is, the thicknesses of different regions are uniform, for example, the thickness uniformity of the nickel silicide growing on a monocrystalline silicon surface, a polycrystalline silicon surface, or the surface of a germanium-silicon epitaxial layer is good. On the contrary, if pre-amorphization ion implantation is not carried out, the nickel silicide growing on the germanium-silicon epitaxial layer will be thinner than the nickel silicide growing on the monocrystalline silicon surface or the polycrystalline silicon surface.

With the advance of technology, the requirement for the uniformity of nickel silicide growing on the silicon surface in different regions is becoming higher and higher particularly for process nodes smaller than 28 nm, to improve the uniformity of the ohm contact resistance of the nickel silicide.

BRIEF SUMMARY

The technical issue to be settled by the invention is to provide a method for manufacturing nickel silicide to improve the uniformity of the ohm contact resistance of the nickel silicide.

To settle the above technical issue, the method for manufacturing nickel silicide of the invention comprises:

Step 1: providing a semiconductor substrate, wherein the semiconductor substrate has an exposed silicon surface which is a formation region of nickel silicide;

Step 2: carrying out pre-amorphization ion implantation to form an amorphous layer in the formation region of the nickel silicide, wherein an implantation source of the pre-amorphization ion implantation is xenon which is an non-radioactive inert gas with the maximum mass, so that the uniformity of an interface layer between the amorphous layer and silicon is optimized; and Step 3: forming the nickel silicide in the formation region of the nickel silicide by self-alignment.

Furthermore, the semiconductor substrate is a silicon substrate or an SOI substrate.

Furthermore, the semiconductor substrate provided in Step 1 is formed with a source region and a drain region of an MOSFET, and the formation region of the nickel silicide includes the source region and the drain region of the MOSFET.

Furthermore, an embedded epitaxial layer is formed in the source region or drain region of the MOSFET to provide a stress for a channel region of the MOSFET to improve the carrier mobility.

Furthermore, the MOSFET is a PMOS transistor or an NMOS transistor.

Furthermore, when the MOSFET is the PMOS transistor, the embedded epitaxial layer is made from SiGe.

Furthermore, when the MOSFET is the NMOS transistor, the embedded epitaxial layer is made from SiP.

Furthermore, the MOSFET further comprises a gate structure, and the gate structure comprises a gate dielectric layer and a gate conductive material layer.

Furthermore, the gate dielectric layer is made from silicon oxide, silicon oxynitride, or a high-dielectric constant material, and the high-dielectric constant material includes hafnium oxide.

Furthermore, the gate conductive material layer is a polysilicon gate, the gate structure is formed on the semiconductor substrate provided in Step 1, and the formation region of the nickel silicide includes the surface of the polysilicon gate.

Furthermore, the gate conductive material layer is a metal gate, and a dummy gate structure is formed in the formation region of the gate structure formed in Step 1 and includes the gate dielectric layer and a polysilicon dummy gate which are stacked in sequence.

Furthermore, the MOSFET is a planar transistor or a fin transistor.

Furthermore, a xenon source of the pre-amorphization ion implantation is gaseous, the implantation energy is 0.5KeV-10KeV, the implantation dose is $1*10^{13}$ cm$^{-2}$-$1*10^{14}$ cm$^{-2}$, the temperature is $-100°$ C.-$25°$ C., and the implantation angle is 0-30°.

Furthermore, the nickel silicide is formed in Step 3 through the following steps: forming a nickel-platinum alloy, and then annealing the nickel-platinum alloy.

The method further comprises the following steps to be performed after Step 3: manufacturing an inter-layer film, forming a tungsten through hole, and carrying out copper interconnection.

Furthermore, the method further comprises the following step to be performed after copper interconnection: testing the ohm contact resistance of the nickel silicide.

According to the invention, the pre-amorphization ion implantation process performed before the formation of the nickel silicide is specially designed in that an implantation source for pre-amorphization ion implantation is xenon which is an non-radioactive inert gas with the maximum mass, so that the uniformity of an interface layer between the amorphous layer and silicon is optimized, that is, compared with a technical solution adopting silicon or germanium as an implantation source of pre-amorphization ion implantation in the prior art, the invention breaks through the conventional thought to adopt xenon as the implantation source for pre-amorphization ion implantation to achieve the optimum uniformity of the interface layer between the amorphous layer and silicon, so that the uniformity, such as the thickness uniformity, of the formed nickel silicide is optimized, wherein the uniformity mentioned herein refers to the uniformity of the nickel silicide in one doped region such as the source region, the drain region or the polysilicon gate as well as the uniformity of the nickel silicide in different doped regions such as the regions between every two of the source region, the drain region and the polysilicon gate, so that the uniformity of the ohm contact resistance of the nickel silicide is improved.

BRIEF DESCRIPTION OF THE DRAWINGS

The invention is further detailed below in combination with the accompanying drawings and embodiments.

DETAILED DESCRIPTION

Figure 1:
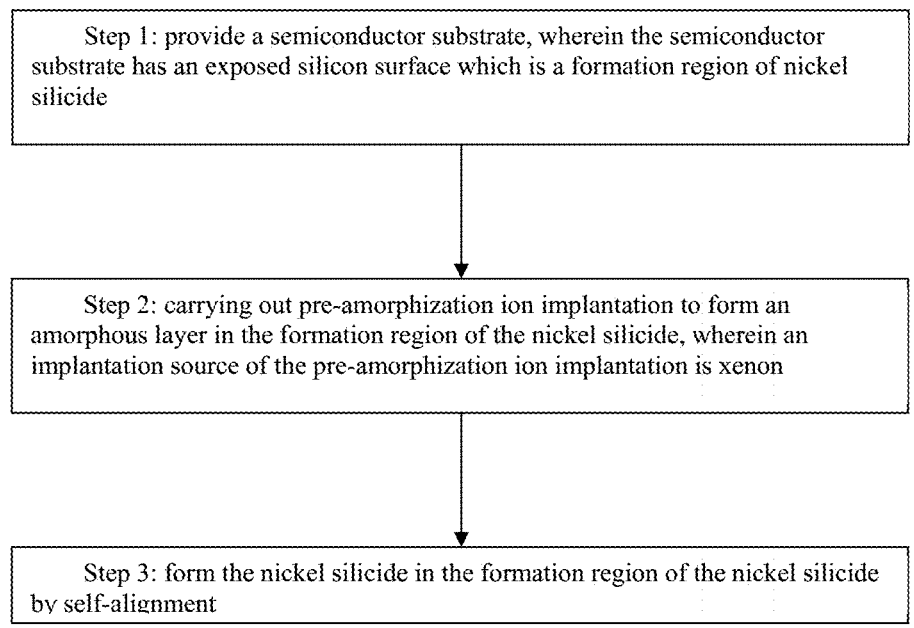
FIG. 1 is a flow diagram of a method for manufacturing nickel silicide in one embodiment of the invention.
Figure 2A:
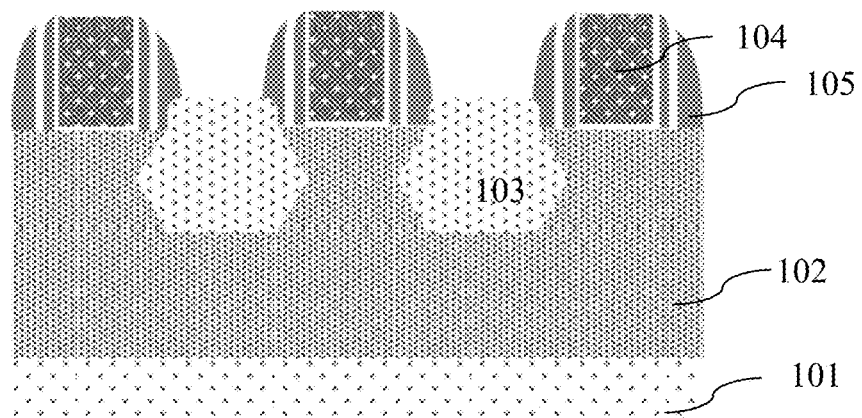
FIG. 2A-FIG. 2C are device structural diagrams of all steps of the method for manufacturing nickel silicide in the embodiment of the invention.
Figure 2B:
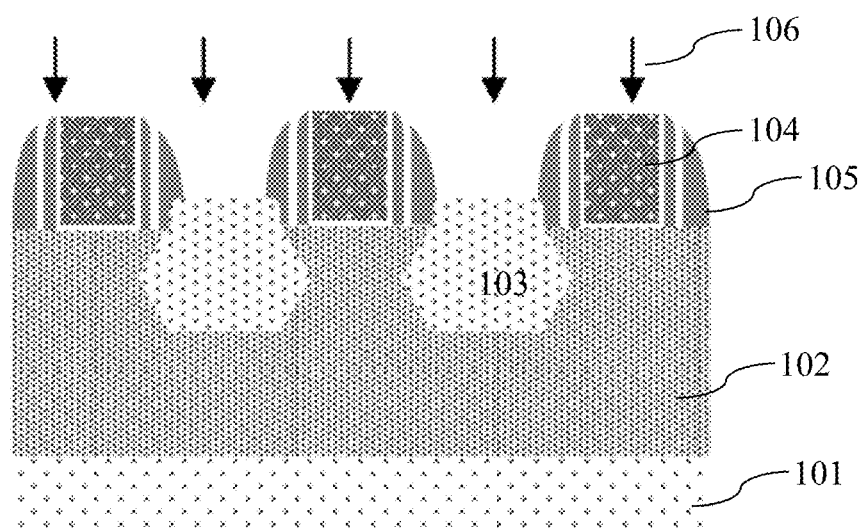
Figure 2C:
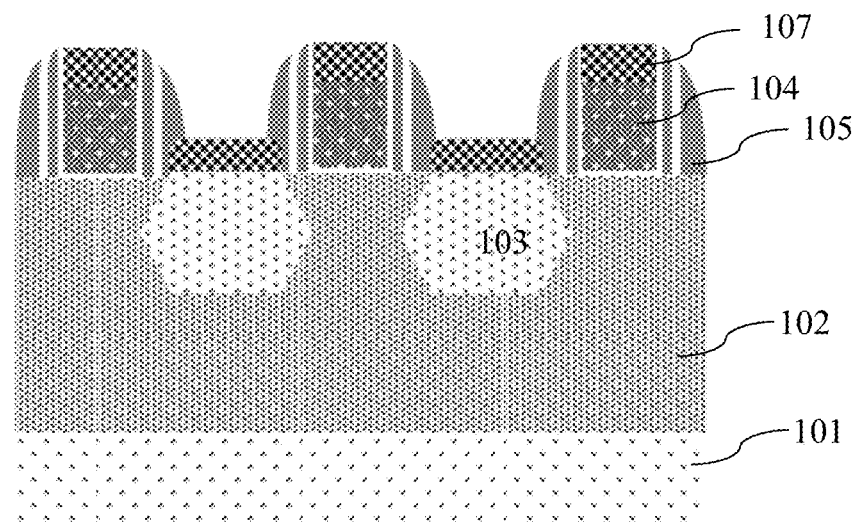

As shown in FIG. 1 which is a flow diagram of a method for manufacturing nickel silicide 107 in one embodiment of the invention and FIG. 2A-FIG. 2C which are device structural diagrams of all steps of the method for manufacturing the nickel silicide 107 in the embodiment of the invention, the method for manufacturing the nickel silicide 107 in this embodiment of the invention comprises:

Step 1: as shown in FIG. 2A, a semiconductor substrate 101 is provided, wherein the semiconductor substrate 101 has an exposed silicon surface which is a formation region of the nickel silicide 107. The top layer of the semiconductor substrate 101 is an epitaxial layer, and the epitaxial layer of the semiconductor substrate 101 is separately marked with a mark 102.

In this embodiment of the method, the semiconductor substrate 101 is a silicon substrate. Or, in other embodiments of the method, the semiconductor substrate 101 is an SOI substrate.

The semiconductor substrate 101 provided in Step 1 is formed with a source region and a drain region of an MOSFET, and the formation region of the nickel silicide 107 includes the source region and the drain region of the MOSFET. As can be known from the subsequent description, the formation region of the nickel silicide 107 further includes the surface of a polysilicon gate.

An embedded epitaxial layer 103 is formed in the source region or drain region of the MOSFET to provide a stress for a channel region of the MOSFET to improve the carrier mobility.

The MOSFET is a PMOS transistor or an NMOS transistor. When the MOSFET is the PMOS transistor, the embedded epitaxial layer 103 is made from SiGe. When the MOSFET is the NMOS transistor, the embedded epitaxial layer is made from SiP. Or, when the MOSFET is the NMOS, the embedded epitaxial layer is not adopted.

The MOSFET further comprises a gate structure, and the gate structure comprises a gate dielectric layer and a gate conductive material layer 104. The gate dielectric layer is made from silicon oxide, silicon oxynitride, or a high-dielectric constant material, and the high-dielectric constant material includes hafnium oxide.

The gate conductive material layer 104 is the polysilicon gate. The gate structure is formed on the semiconductor substrate 101 provided in Step 1, and the formation region of the nickel silicide 107 includes the surface of the polysilicon gate. Spacers 105 are formed on the side face of the gate structure. The number of the spacers 105 is two, and lightly-doped drain (LDD) implantation is carried out after the first spacer is formed. In the case where the PMOS transistor and the NMOS transistor are integrally manufactured, the following steps are performed: after the first spacer is formed, P-type LDD (PLDD) implantation is carried out on the PMOS transistor to form an embedded SiGe epitaxial layer, then N-type LDD (NLDD) implantation is carried out on the NMOS transistor, if the NMOS transistor adopts an embedded epitaxial layer, the embedded epitaxial layer of the NMOS transistor is formed, and then the second spacer is formed; or if the NMOS transistor does not adopt an embedded epitaxial layer, the second spacer is formed after NLDD. After the second spacer is formed, source-drain implantation is carried out on the PMOS transistor and the NMOS transistor.

Or, in other embodiments, the gate conductive material layer 104 is a metal gate, a dummy gate structure is formed in the formation region of the gate structure formed in Step 1 and includes the gate dielectric layer and a polysilicon dummy gate which are stacked in sequence. The polysilicon dummy gate will be removed subsequently after a zero inter-layer film is formed, and the metal gate is formed in a removal region of the polysilicon dummy gate.

Generally, the formation region of the nickel silicide 107 is opened to expose the corresponding silicon surface by forming a metal silicide barrier layer and patterning the metal silicide barrier layer.

In this embodiment of the method, the MOSFET is a planar transistor, that is, a channel of the channel region is located on only one plane. Or, in other embodiments, the MOSFET is a planar transistor or a fin transistor.

Step 2: as shown in FIG. 2B, pre-amorphization ion implantation marked by 106 is carried out to form an amorphous layer in the formation region of the nickel silicide 107, wherein an implantation source of the pre-amorphization ion implantation is xenon which is an non-radioactive inert gas with the maximum mass, so that the uniformity of an interface layer between the amorphous layer and silicon is optimized, that is, compared with any implantation sources adopted in existing methods for manufacturing nickel silicide, the xenon implantation source adopted in this embodiment of the invention fulfils better uniformity of the interface layer between the amorphous layer and the silicon.

A xenon source of the pre-amorphization ion implantation is gaseous, the implantation energy is 0.5KeV-10KeV, the implantation dose is $1*10^{13}$ cm$^{-2}$-$1*10^{14}$ cm$^{-2}$, the temperature is −100° C.-25° C., and the implantation angle is 0-30°. Compared with pre-amorphization ion implantation at a normal temperature, the pre-amorphization ion implantation is carried out at a lower temperature in this embodiment, so that the uniformity of the interface layer between the amorphous layer and the silicon is further improved by decreasing the temperature of the pre-amorphization ion implantation.

Step 3: as shown in FIG. 2C, the nickel silicide 107 is formed in the formation region of the nickel silicide 107 by self-alignment.

The nickel silicide 107 is formed in Step 3 through the following steps: a nickel-platinum alloy is formed, and then the nickel-platinum alloy is annealed twice in general. During primary annealing, the nickel-platinum alloy reacts with silicon to form Ni2Si; and during secondary annealing, Ni2Si is converted into NiSi.

The nickel silicide manufacturing method further comprises the following steps to be performed after Step 3: an inter-layer film is manufactured, a tungsten through hole is formed, and copper interconnection is carried out.

The method further comprises the following step to be performed after copper interconnection: the ohm contact resistance of the nickel silicide 107 is tested.

According to this embodiment of the invention, the pre-amorphization ion implantation process performed before the formation of the nickel silicide 107 is specially designed in that an implantation source for pre-amorphization ion implantation is xenon which is an non-radioactive inert gas with the maximum mass, so that the uniformity of an interface layer between the amorphous layer and silicon is optimized, that is, compared with a technical solution adopting silicon or germanium as an implantation source of pre-amorphization ion implantation in the prior art, the invention breaks the conventional thought to adopt xenon as the implantation source for pre-amorphization ion implantation to achieve the optimum uniformity of the interface layer between the amorphous layer and silicon, so that the uniformity, such as the thickness uniformity, of the formed nickel silicide 107 is optimized, wherein the uniformity mentioned herein refers to the uniformity of the nickel silicide 107 in one doped region such as the source region, the drain region or the polysilicon gate as well as the uniformity of the nickel silicide 107 in different doped regions such as the regions between every two of the source region, the drain region and the polysilicon gate, so that the uniformity of the ohm contact resistance of the nickel silicide 107 is improved.

The invention is detailed above with reference to embodiments, but these embodiments are not intended to limit the invention. Various transformations and improvements can be made by those skilled in the art without deviating from the principle of the invention, and all these transformations and improvements should also fall within the protection scope of the invention.

What is claimed is:

1. A method for manufacturing nickel silicide, comprising:

Step 1: providing a semiconductor substrate, wherein the semiconductor substrate has an exposed silicon surface which is a formation region of nickel silicide, wherein the semiconductor substrate is formed with a source region and a drain region of a MOSFET, the formation region of the nickel silicide includes the source region and the drain region of the MOSFET, and an embedded epitaxial layer is formed in the source region or the drain region of the MOSFET to provide a stress for a channel region of the MOSFET to improve carrier mobility;

Step 2: carrying out pre-amorphization ion implantation to form an amorphous layer in the formation region of the nickel silicide, wherein an implantation source of the pre-amorphization ion implantation is xenon which is a non-radioactive inert gas with the maximum mass, so that uniformity of an interface layer between the amorphous layer and the exposed silicon surface is optimized, wherein a xenon source of the pre-amorphization ion implantation is gaseous, implantation energy is 0.5KeV-10KeV, an implantation dose is $1*10^{13}$ cm$^{-2}$-$1*10^{14}$ cm$^{-2}$, a temperature is −100° C.-25° C., and an implantation angle is 0-30°; and Step 3: forming the nickel silicide in the formation region of the nickel silicide by self-alignment.

2. The method for manufacturing nickel silicide according to claim 1, wherein the semiconductor substrate is a silicon substrate or an SOI substrate.

3. The method for manufacturing nickel silicide according to claim 1, wherein the MOSFET is a PMOS transistor or an NMOS transistor.

4. The method for manufacturing nickel silicide according to claim 3, wherein when the MOSFET is the PMOS transistor, the embedded epitaxial layer is made from SiGe.

5. The method for manufacturing nickel silicide according to claim 3, wherein when the MOSFET is the NMOS transistor, the embedded epitaxial layer is made from SiP.

6. The method for manufacturing nickel silicide according to claim 1, wherein the MOSFET further comprises a gate structure, and the gate structure comprises a gate dielectric layer and a gate conductive material layer.

7. The method for manufacturing nickel silicide according to claim 6, wherein the gate dielectric layer is made from silicon oxide, silicon oxynitride, or a high-dielectric constant material, and the high-dielectric constant material includes hafnium oxide.

8. The method for manufacturing nickel silicide according to claim 6, wherein the gate conductive material layer is a polysilicon gate, the gate structure is formed on the semiconductor substrate provided in Step 1, and the formation region of the nickel silicide includes a surface of the polysilicon gate.

9. The method for manufacturing nickel silicide according to claim 6, wherein the gate conductive material layer is a metal gate, and a dummy gate structure is formed in the formation region of the gate structure formed in Step 1 and includes the gate dielectric layer and a polysilicon dummy gate which are stacked in sequence.

10. The method for manufacturing nickel silicide according to claim 1, wherein the MOSFET is a planar transistor or a fin transistor.

11. The method for manufacturing nickel silicide according to claim 1, wherein the nickel silicide is formed in Step 3 through the following steps: forming a nickel-platinum alloy, and then annealing the nickel-platinum alloy;

the method further comprises the following steps to be performed after Step 3: manufacturing an inter-layer film, forming a tungsten through hole, and carrying out copper interconnection.

12. The method for manufacturing nickel silicide according to claim 11, wherein the method further comprises the following step to be performed after copper interconnection: testing an ohm contact resistance of the nickel silicide.

\* \* \* \* \*